United States Patent
Kimura

(10) Patent No.: US 6,621,156 B2
(45) Date of Patent: Sep. 16, 2003

(54) SEMICONDUCTOR DEVICE HAVING STACKED MULTI CHIP MODULE STRUCTURE

(75) Inventor: Naoto Kimura, Kumamoto (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/053,650

(22) Filed: Jan. 24, 2002

(65) Prior Publication Data
US 2002/0096785 A1 Jul. 25, 2002

(30) Foreign Application Priority Data
Jan. 24, 2001 (JP) .......................................... 2001-016395

(51) Int. Cl.⁷ ................................................ H01L 23/02
(52) U.S. Cl. ........................ 257/686; 257/724; 257/784
(58) Field of Search ................................. 257/686, 723, 257/724, 777, 687, 784

(56) References Cited

U.S. PATENT DOCUMENTS 6,297,547 B1 * 10/2001 Akram
6,353,263 B1 * 3/2002 Dotta et al.
6,365,963 B1 * 4/2002 Shimada
6,469,376 B2 * 10/2002 Vaiyapuri
6,489,686 B2 * 12/2002 Farooq et al.
6,507,098 B1 * 1/2003 Lo et al.

FOREIGN PATENT DOCUMENTS

| JP | 2000-133844 | 5/2000 |
|----|-------------|--------|
| JP | 2000-269408 | 9/2000 |
| JP | 2000-277559 | 10/2000 |
| JP | 2000-294722 | 10/2000 |

* cited by examiner

Primary Examiner—Sheila V. Clark
(74) Attorney, Agent, or Firm—Young & Thompson

(57) ABSTRACT

A semiconductor device in which a plurality of semiconductor chips are stacked. The semiconductor device includes a lower semiconductor chip bonded onto a surface of a wiring substrate; an upper semiconductor chip; and one or more spacers which are bonded to the surface of the wiring substrate and which support the upper chip over the lower chip and at a location separated from the lower chip. Conductors electrically connect the lower chip to the wiring substrate and extend through the spacers.

15 Claims, 3 Drawing Sheets

PRIOR ART

SEMICONDUCTOR DEVICE HAVING STACKED MULTI CHIP MODULE STRUCTURE

FIELD OF THE INVENTION

The present invention relates generally to a semiconductor device having a Multi Chip Module (MCM) structure and a method of manufacturing such semiconductor device. More particularly, the present invention relates to a semiconductor device and a method of manufacturing such semiconductor device in which a plurality of semiconductor chips are stacked and in which a larger semiconductor chip can be appropriately stacked over a smaller semiconductor chip.

BACKGROUND OF THE INVENTION

Recently, in order to avoid an expansion of mounting area or areas of semiconductor devices and to increase mounting density, there are proposed various types of semiconductor devices having a stacked MCM structure. For example, there is proposed a semiconductor device having a stacked Chip Size Package (CSP) structure in which a plurality of semiconductor chips are closely stacked and mounted on a wiring board or substrate.

FIG. 3 is a cross sectional view showing a conventional semiconductor device having such stacked CSP structure (prior art 1). In the semiconductor device shown in FIG. 3, a lower side semiconductor chip 102 is bonded onto a surface of a wiring substrate 101 via insulating adhesive and the like, and an upper side semiconductor chip 103 is stacked and bonded onto the lower side semiconductor chip 102 via insulating adhesive and the like. On the surface of the wiring substrate 101, there is formed a wiring layer having wiring patterns (not shown in the drawing) On the top surfaces of the lower side semiconductor chip 102 and of the upper side semiconductor chip 103, there are formed electrodes, i.e., bonding pads, 102a and 103a, respectively. These electrodes 102a and 103a are coupled with electrodes 101a formed on the wiring substrate 101 via bonding wires 104 and 105 made of gold and the like, respectively, and thereby the lower side semiconductor chip 102 and the upper side semiconductor chip 103 are electrically coupled with the wiring patterns on the wiring substrate 101.

Also, there are disposed a plurality of solder balls 106 on the backside surface of the wiring substrate 101. The solder balls 106 are coupled with the wiring patterns formed on the surface of the wiring substrate 101 via holes provided in the wiring substrate 101 (not shown in the drawing). Thereby, the lower side semiconductor chip 102 and the upper side semiconductor chip 103 are electrically coupled with the solder balls 106. Further, on the wiring substrate 101, there is formed an encapsulation resin 107 for encapsulating the lower side semiconductor chip 102, the upper side semiconductor chip 103 and the bonding wires 104 and 105.

In the semiconductor device mentioned above, the upper side semiconductor chip 103 disposed on the upside is, for example, a memory IC chip, such as a DRAM device and the like. The lower side semiconductor chip 102 disposed on the downside is, for example, a system IC chip, such as a microprocessor and the like. The size of the upper side semiconductor chip 103 is made smaller than that of the lower side semiconductor chip 102 such that the electrodes of the lower side semiconductor chip 102 on the downside can be exposed.

However, according to an advance in semiconductor technology, the feature size of a semiconductor integrated circuit prescribed by the design rule becomes smaller and smaller. Therefore, the size of a semiconductor chip becomes smaller as the feature size becomes smaller while retaining the same function. Thus, according to the reduction of the feature size, there is a possibility that the size of the lower side semiconductor chip 102 becomes smaller than that of the upper side semiconductor chip 103. In such case, conventionally, the lower side semiconductor chip 102 having a smaller size and the upper side semiconductor chip 103 having a larger size are replaced upside down. That is, the upper side semiconductor chip 103 is mounted on a wiring substrate and the lower side semiconductor chip 102 is mounted on the upper side semiconductor chip 103. Therefore, conventionally, the semiconductor chip having a smaller size is always used as the upper side semiconductor chip and the semiconductor chip having a larger size is always used as the lower side semiconductor chip, so that when both the semiconductor chips are stacked on a wiring substrate, electrodes, i.e., bonding pads, of the semiconductor chip on the lower side are not hidden by the semiconductor chip on the upper side. Thus, it is possible to couple electrodes of the semiconductor chips on both the upper side and lower side with wiring patterns on the wiring substrate via metal wires.

Japanese patent laid-open publication No. 2000-269408 discloses another type of semiconductor device having a stacked MCM structure, which is hereafter referred to as prior art 2. In the semiconductor device of the prior art 2, interference between semiconductor chips caused by stacking or bonding the semiconductor chips directly are avoided and degree of freedom of wiring of the wiring substrate can be improved.

FIG. 4 is a cross sectional view showing the semiconductor device of the prior art 2. In the semiconductor device shown in FIG. 4, on the upper surface of a multi-layer wiring substrate 201, a lower side semiconductor chip 202 is bonded by using adhesive and the like. Electrodes (not shown in the drawing) formed on the upper surface of the multi-layer wiring substrate 201 are coupled with electrodes (not shown in the drawing) formed on the upper surface of the lower side semiconductor chip 202 via bonding wires 203. On the upper surface of the lower side semiconductor chip 202, various circuit elements are also formed. Solder balls 204 are disposed on the under side surface of the multi-layer wiring substrate 201, and are coupled with multi-layer wiring conductors formed on the upper side surface of the multi-layer wiring substrate 201 via holes formed in the substrate 201.

Also, on the multi-layer wiring substrate 201, spacers or dam members 205 are formed which have a height larger than the thickness of the lower side semiconductor chip 202. On the dam member 205, lead portions 206b of a lead frame 206 are disposed. An upper side semiconductor chip 207 is bonded on a stage portion 206a of the lead frame 206. Also, electrodes (not shown in the drawing) formed on the upper surface, i.e., the surface on which circuits are formed, of the upper side semiconductor chip 207 are connected to the lead portions 206b via bonding wires 208. Further, the lead portions 206b and the multi-layer wiring of the substrate 201 are coupled via bonding wires 209. By this structure, the upper side semiconductor chip 207 is held at a location which is over the lower side semiconductor chip 202 and which is separated from the lower side semiconductor chip 202, and also the upper side semiconductor chip 207 is electrically coupled with the multi-layer wiring substrate 201. Further, these upper side semiconductor chip 207 and lower side semiconductor chip 202, the space between these chips 207 and 202, the dam members 205 and the bonding wires 203, 208 and 209 are encapsulated by an encapsulation resin 210.

However, in the semiconductor device of the above-mentioned prior art 1, when the design rule has changed, it becomes necessary to replace the semiconductor chips upside down. In such case, it is necessary to redesign the wiring substrate and fabricate it again. Therefore, manufacturing costs of the semiconductor device of the prior art 1 become high.

In the semiconductor device of the above-mentioned prior art 2, it is necessary to couple the lead portions 206*b* on the dam member 205 with the multi-layer wiring substrate 201 via bonding wires 209. Therefore, bonding times become large, and wiring structure becomes complicated. Also, the lead frame 206 for mounting the upper side semiconductor chip 207 is required. Therefore, manufacturing costs of the semiconductor device the prior art 2 also become high.

SUMMARY OF THE INVENTION

Therefore, it is an object of the present invention to provide a semiconductor device having a stacked Multi Chip Module structure in which a larger semiconductor chip can be appropriately stacked over a smaller semiconductor chip, and to provide a method of manufacturing such semiconductor device.

It is another object of the present invention to provide a semiconductor device having a stacked Multi Chip Module structure in which a larger semiconductor chip can be appropriately stacked over a smaller semiconductor chip and which has a simple structure, and to provide a method of manufacturing such semiconductor device.

It is still another object of the present invention to provide a stacked MCM type semiconductor device which can be manufactured at low cost even if the chip size or sizes of the semiconductor device have changed due to the change of the design rule, and to provide a method of manufacturing such semiconductor device.

It is still another object of the present invention to obviate the disadvantages of conventional semiconductor devices having a stacked Multi Chip Module structure.

According to an aspect of the present invention, there is provided a semiconductor device comprising: a wiring substrate; a lower side semiconductor chip bonded onto a surface of the wiring substrate; an upper side semiconductor chip; one or more spacers which are bonded onto the surface of the wiring substrate and which support the upper side semiconductor chip over the lower side semiconductor chip and at a location separated from the lower side semiconductor chip; conductors which electrically couple the upper side semiconductor chip and the lower side semiconductor chip with the wiring substrate; and an encapsulating resin portion which encapsulates the upper side semiconductor chip, the lower side semiconductor chip, the one or more spacers and the conductors on the wiring substrate.

In this case, it is preferable that the size of the upper side semiconductor chip is larger than that of the lower side semiconductor chip.

It is also preferable that lower end portion or portions and upper end portion or portions of the one or more spacers are bonded to the wiring substrate and the upper side semiconductor chip, respectively, via insulating adhesive.

It is further preferable that the wiring substrate and the one or more spacers are bonded via the conductors interposed therebetween and by using insulating adhesive.

It is advantageous that the one or more spacers comprise a single spacer member.

It is also advantageous that the one or more spacers comprise a plurality of spacer members.

It is further advantageous that the semiconductor device further comprises solder bumps disposed on the backside of the wiring substrate.

It is preferable that the lower side semiconductor chip is a system IC chip and the upper side semiconductor chip is a memory IC chip.

It is also preferable that the conductors are bonding wires made of gold or gold alloy.

According to another aspect of the present invention, there is provided a method of manufacturing a semiconductor device comprising: preparing a wiring substrate; mounting a lower side semiconductor chip onto a surface of the wiring substrate; electrically coupling the lower side semiconductor chip with the wiring substrate via conductors; bonding one or more spacers onto the surface of the wiring substrate by using insulating adhesive; bonding an upper side semiconductor chip onto the one or more spacers by using insulating adhesive to support the upper side semiconductor chip over the lower side semiconductor chip and at a location separated from the lower side semiconductor chip; electrically coupling the upper side semiconductor chip with the wiring substrate via conductors; and encapsulating the upper side semiconductor chip, the lower side semiconductor chip, the one or more spacers and the conductors on the wiring substrate 1 with encapsulating resin.

In this case, it is preferable that, in the bonding one or more spacers onto the surface of the wiring substrate by using insulating adhesive, the one or more spacers are bonded onto the wiring substrate via the conductors interposed therebetween.

It is also preferable that the size of the upper side semiconductor chip is larger than that of the lower side semiconductor chip.

It is further preferable that the one or more spacers comprise a single spacer member.

It is advantageous that the one or more spacers comprise a plurality of spacer members.

It is also advantageous that the method further comprises disposing solder bumps on the backside of the wiring substrate.

In the above-mentioned semiconductor device, when a plurality of semiconductor chips are stacked on a wiring substrate, a semiconductor chip disposed upside is supported over a semiconductor chip disposed below by using spacer or spacers. Therefore, even when the size of the semiconductor chip disposed below becomes smaller than that of the semiconductor chip disposed upside, it is possible to easily realize electrical connection between the semiconductor chip disposed below and the wiring substrate.

By using insulating adhesive to bond the spacer or spacers with the wiring substrate, it is possible to bond the spacer or spacers with the wiring substrate via the conductive wires which are interposed therebetween and which electrically couple the semiconductor chip disposed downside and the wiring substrate. Therefore, it is not necessary to previously reserve area or areas on the wiring substrate for bonding the spacers.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the attached drawings, an explanation will now be made on a semiconductor device according to an embodiment of the present invention and on a method of manufacturing such semiconductor device.

Figure 1:
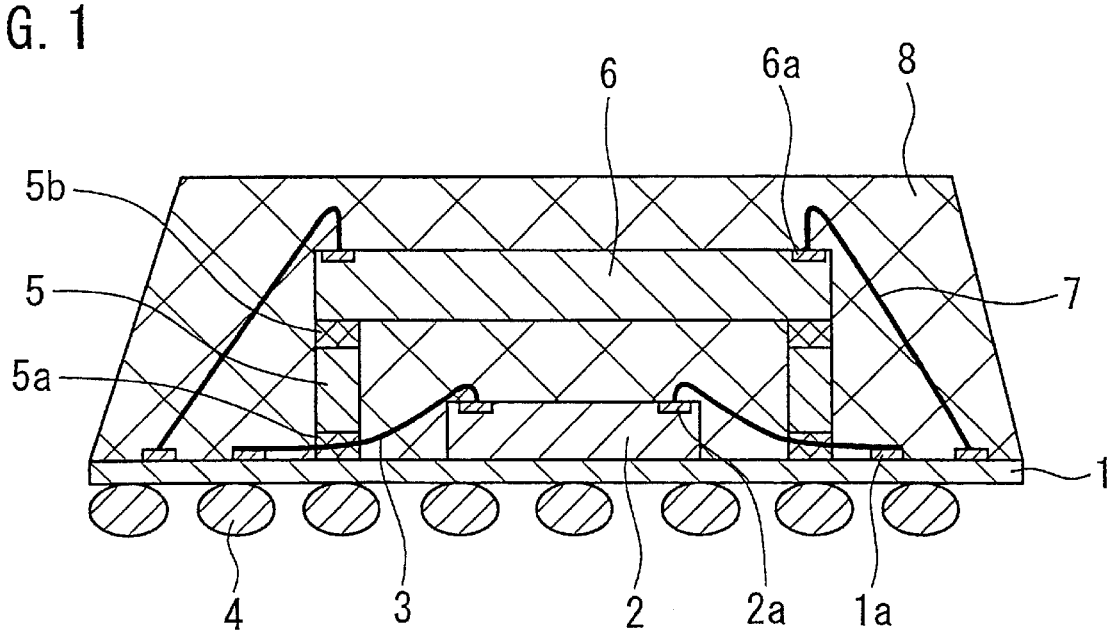
FIG. 1 is a cross sectional view showing a semiconductor device according an embodiment of the present invention.

FIG. 1 is a cross sectional view showing a semiconductor device according to an embodiment of the present invention. As shown in FIG. 1, the semiconductor device according to the embodiment of the present invention comprises a wiring substrate 1 which has multilayer wirings formed on the upper surface thereof. On the upper surface of the wiring substrate 1, a lower side semiconductor chip 2 is bonded via insulating adhesive and the like. The lower side semiconductor chip 2 is, for example, a system IC comprising a microprocessor and the like. The upside surface of the lower side semiconductor chip 2 is an active surface or a circuit forming surface on which various circuit elements and the like are formed. In the periphery of the active surface of the lower side semiconductor chip 2, there are formed electrodes or bonding pads 2a. The bonding pads 2a are coupled with electrodes 1a formed on the upper surface of the wiring substrate 1, via wiring conductors or bonding wires 3 which are made, for example, of gold, gold alloy or the like. Thereby, the lower side semiconductor chip 2 are electrically coupled with the wiring substrate 1.

On the under side of the wiring substrate 1, there are disposed solder bumps or solder balls 4. The solder bumps 4 are electrically coupled with wiring portions on the upper surface of the wiring substrate 1, via holes (not shown in the drawing) of the wiring substrate 1. Also, spacer or spacers 5 are disposed on upper side of the wiring substrate 1 and at the sides of the lower side semiconductor chip 2. The spacer or spacers 5 are joined by using insulating adhesive 5a onto the wiring substrate 1, via the bonding wires 3 interposed therebetween. The spacer or spacers 5 have a height higher than the thickness of the lower side or under side semiconductor chip 2. Also, an upper side semiconductor chip 6 is joined or bonded onto the upper surfaces of the spacer or spacers 5 by using insulating adhesive 5b.

The spacer or spacers 5 support the upper side semiconductor chip 6, and, therefore, the number, shape, material and the like can be any one, as long as they can appropriately support the upper side semiconductor chip 6 over the lower side semiconductor chip 2. For example, the number of the spacer or spacers 5 can be one, two, four or any other number. The spacer 5 can be one ring-shaped member surrounding the lower side semiconductor chip 2. It is also possible to dispose a plurality of spacers along the sides of the lower side semiconductor chip 2. The spacer or spacers 5 can comprise two spacer members one of which is disposed at one side of the lower side semiconductor chip 2 and the other one of which is disposed at the opposing side. Since the spacer or spacers 5 are bonded onto the wiring substrate 1 by using insulating adhesive, it is possible to bond the spacer or spacers 5 onto the wiring substrate 1 in condition the metal wires 3 are interposed between the spacer or spacers 5 and the wiring substrate 1. Therefore, high degree of freedom of bonding location of the spacer or spacers 5 can be obtained. The spacer or spacers 5 are preferably made of insulating material, for example, resin, ceramic or the like. Also, the spacer or spacers 5 can be made of metal, if they are insulated from the metal wires 3 via, for example, the insulating adhesive 5a. Further, the spacer or spacers 5 can be joined onto the wiring substrate 1 at the location or locations the metal wires 3 are not disposed.

The upper side semiconductor chip 6 is, for example, a memory IC chip such as a DRAM device and the like. The upside surface of the upper side semiconductor chip 6 is an active surface or a circuit forming surface on which various circuit elements and the like are formed. In the periphery of the active surface of the upper side semiconductor chip 6, there are formed electrodes or bonding pads 6a. The bonding pads 6a are coupled with electrodes 1a formed on the upper surface of the wiring substrate 1, via wiring conductors or bonding wires 7 which are made, for example, of gold, gold alloy or the like. Thereby, the upper side semiconductor chip 6 are electrically coupled with the wiring substrate 1.

Further, on the wiring substrate 1, there is formed an encapsulation resin 8 which encapsulates the lower side semiconductor chip 2, the upper side semiconductor chip 6, the spacer or spacers 5, and the metal wires 3 and 7 which couple these components.

An explanation will now be made on a method of manufacturing the above-mentioned semiconductor device. First, onto the wiring substrate 1, the lower side semiconductor chip 2 is bonded by using insulating adhesive. Also, the lower side semiconductor chip 2 and the wiring substrate 1 are coupled by wire bonding. That is, the lower side semiconductor chip 2 and the wiring substrate 1 are electrically coupled by the bonding wires 3. Next, spacer or spacers 5 made, for example, of metal, resin or the like are bonded onto the wiring substrate 1 at the outside portion or portions of the lower side semiconductor chip 2, by using the insulating adhesive 5a. Since the spacer or spacers 5 are bonded onto the wiring substrate 1 by using insulating adhesive, it is possible to interpose the bonding wires 3, which couple the lower side semiconductor chip 2 with the wiring substrate 1, between the spacer or spacers 5 and the wiring substrate 1. Then, the upper side semiconductor chip 6 having a larger size than that of the lower side semiconductor chip 2 is bonded on the spacer or spacers 5 by using insulating adhesive 5b. The upper side semiconductor chip 6 and the wiring substrate 1 are then electrically coupled via bonding wires 7, by wire bonding. Thereafter, whole area of the device is encapsulated by the encapsulation resin 8. Then, solder balls 4 are bonded from the backside of the wiring substrate 1.

Figure 2A:
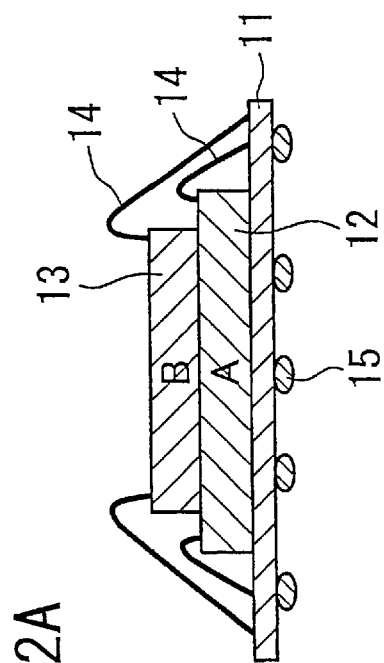
FIG. 2A is a schematic cross sectional view showing a structure of a semiconductor device before the design rule is changed.
Figure 2B:
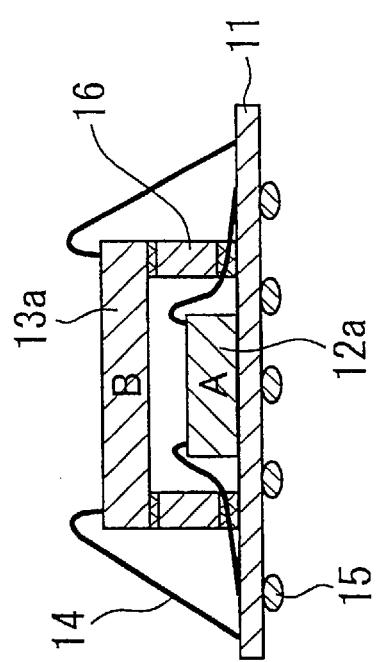
FIG. 2B is a schematic cross sectional view showing a structure of a semiconductor device according to the present invention after the design rule is changed.
Figure 2C:
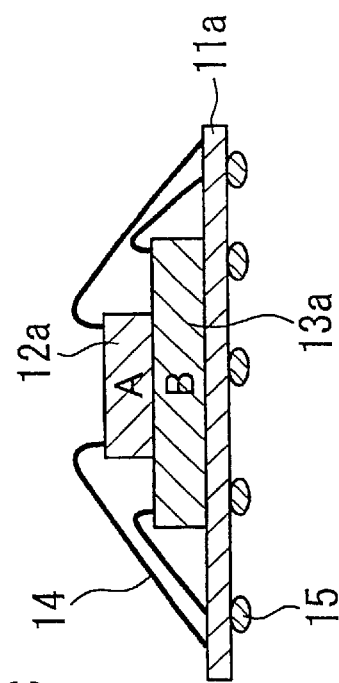
FIG. 2C is a schematic cross sectional view showing a structure of a conventional semiconductor device after the design rule is changed.

With reference to FIG. 2A through FIG. 2C, an explanation will be made on the advantageous effect of the semiconductor device according to the present invention. FIG.

2A is a cross sectional view showing a schematic structure of a semiconductor device before the design rule is changed. FIG. 2B and FIG. 2C are cross sectional views showing semiconductor devices after the design rule is changed. FIG. 2B and FIG. 2C show the semiconductor device according to the above-mentioned embodiment of the present invention and the conventional semiconductor device fabricated in accordance with the prior art 1, respectively.

Figure 3:
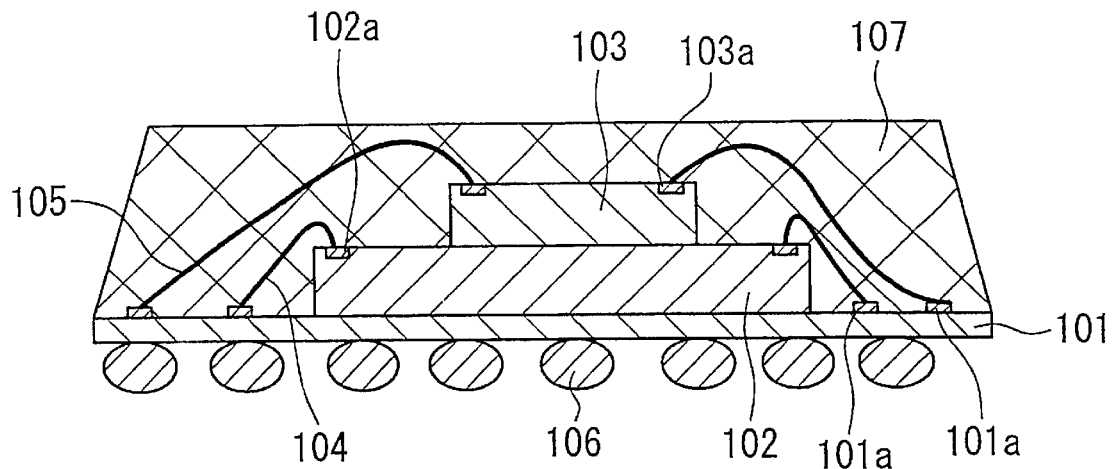
FIG. 3 is a cross sectional view showing a conventional semiconductor device having a stacked CSP structure as a prior art 1.
Figure 4:
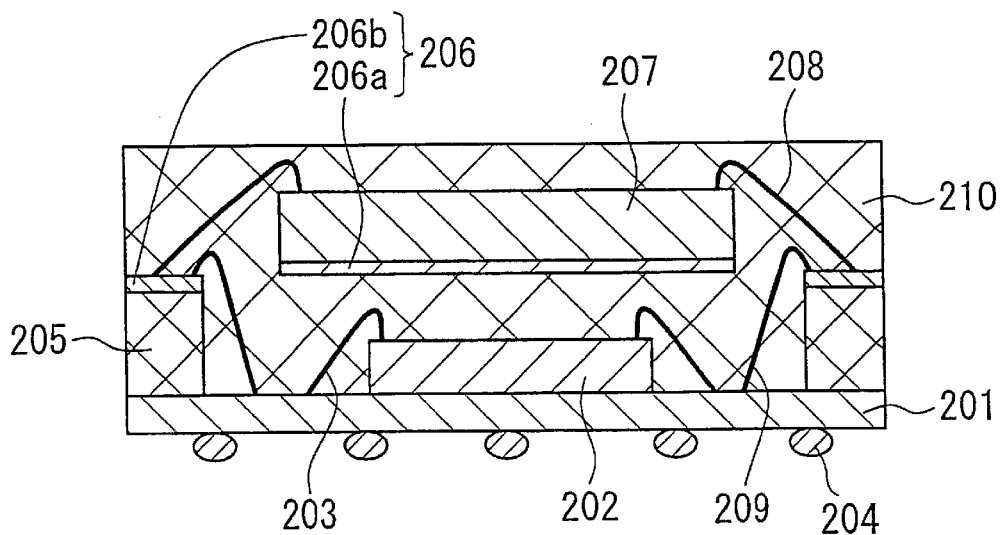
FIG. 4 is a cross sectional view showing a conventional semiconductor device as a prior art 2.

FIG. 2A shows the semiconductor device mentioned above with reference to FIG. 3. As shown in FIG. 2A, usually, when a plurality of (two, in FIG. 2A) semiconductor chips are closely stacked on a wiring substrate 11, A-chip 12 on the lower side has a size larger than that of B-chip 13 on the upper side, so that electrodes not shown in the drawing formed on the upper surface of the A-chip 12 on the lower side are exposed. That is, among the semiconductor chips to be stacked on a wiring substrate 11, a semiconductor chip having a smaller size is stacked on a semiconductor chip having a larger size. These A-chip 12 and B-chip 13 are electrically coupled with the wiring substrate 11 via metal wires 14. On the backside or lower side surface of the wiring substrate 11, there are disposed a plurality of solder balls 15.

In such semiconductor device shown in FIG. 2A, when the design rule of the semiconductor chip or chips is reduced and the size of the A-chip 12 on the lower side becomes smaller than that of the B-chip 13 of upside, conventionally, it was necessary to replace the A-chip 12 and the B-chip 13. That is, as shown in FIG. 2C, the semiconductor chips are disposed upside down, so that a larger B-chip 13a is mounted downside and a smaller A-chip 12a is mounted upside. However, when the semiconductor chips are to be mounted upside down, it is necessary to re-design wiring patterns of the wiring substrate 11 and to again fabricate a new wiring substrate 11a in which the B-chip 13a can be mounted downside and the A-chip 12a can be mounted upside on the B-chip 13a.

On the other hand, in the semiconductor device according to the present invention, when the size or sizes of semiconductor chips are changed and the size of the A-chip 12 on the lower side becomes smaller than that of the B-chip 13 of upside, it is not necessary to replace the semiconductor chips upside down. That is, as shown in FIG. 2B, it is possible to mount the A-chip 12a having a smaller size on the wiring substrate 11, and to mount the B-chip 13a having a larger size over the A-chip 12a via spacer or spacers 16. In this way, since the semiconductor chips are not replaced upside down, it is not necessary to re-design wiring patterns of the wiring substrate 11 and it is not necessary to fabricate a wiring substrate having different wiring patterns again. Therefore, when compared with the structure in which the semiconductor chips are replaced upside down, it is possible to save manufacturing costs and time.

According to the above-mentioned embodiment, in the semiconductor device in which a plurality of semiconductor chips are mounted or stacked on a wiring substrate, an upper side semiconductor chip is supported over and separately from a lower side semiconductor chip, by spacer or spacers. Therefore, the size of the semiconductor chip disposed upside can be larger than that of the semiconductor chip disposed downside. Thus, when the lower side semiconductor chip becomes smaller than the size of the upper side semiconductor chip due to the reduction of a design rule, it is not necessary to replace the semiconductor chips upside down. Also, it is not necessary to re-design wiring patterns of the wiring substrate and it is not necessary to re-fabricate the wiring substrate.

The present invention can also be advantageously applied to a semiconductor device in which the upper side semiconductor chip should be separated from the lower side semiconductor chip. For example, the structure according to the present invention can be advantageously used in case there occurs an electric or magnetic interference between the upper semiconductor chip and the lower semiconductor chip to be stacked if they are directly bonded together. Also, the structure according to the present invention can be advantageously used in case there occurs thermal stress at the bonded portion between the upper semiconductor chip and the lower semiconductor chip to be stacked if they are closely bonded together by using, for example, adhesive. In such case, when compared with the structure of the above-mentioned prior art 2, the structure according to the present invention can be simpler and manufacturing costs can be lower.

Also, in the above-mentioned embodiment, the semiconductor chip disposed upside has a larger size than that of the semiconductor chip disposed downside. However, the present invention can be applied to various other cases. For example, when the upper side semiconductor chip and/or the lower side semiconductor chip have rectangular shape, if the long side of the upper side semiconductor chip is longer than the short side of the lower side semiconductor chip, it is possible to use the above-mentioned structure according to the present invention. That is, the upper side semiconductor chip and the lower side semiconductor chip are disposed such that the long side of the upper side semiconductor chip becomes parallel to the short side of the lower side semiconductor chip. Thereby, the upper side semiconductor chip can be supported over the lower side semiconductor chip, by using the spacer or spacers, as in the embodiment mentioned above.

As mentioned above, according to the present invention, in a semiconductor device having an stacked MCM structure in which a plurality of semiconductor chips are mounted on a wiring substrate, even when the size of a semiconductor chip formerly disposed downside becomes smaller than that of a semiconductor chip disposed upside due to the reduction of the design rule of semiconductor chip or chips, it is not necessary to replace the semiconductor chips upside down. According to the present invention, it is possible to mount a plurality of semiconductor chips on the wiring substrate such that the semiconductor chip having a larger size is located over the semiconductor chip having a smaller size. Therefore, it is not necessary to re-design wiring patterns of the wiring substrate and it is not necessary to re-fabricate the wiring substrate, so that manufacturing costs of a semiconductor device can be greatly saved.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as falling within the scope of the appended claims.

What is claimed is:

1. A semiconductor device, comprising:
   a substrate having a first surface with a periphery that has a wiring pattern thereon;
   a first semiconductor device attached to said first surface inside said periphery;

a second semiconductor device mounted on said first surface;

a spacer on said first surface between said first semiconductor device and said periphery, said spacer extending from said first surface to a height greater than a height of said first semiconductor device and being attached to said second semiconductor device, said spacer holding said second semiconductor device spaced from said first semiconductor device and so that said first semiconductor device is sandwiched between said second semiconductor device and said first surface;

first conductors that electrically connect said first semiconductor device to said wiring pattern on said periphery; and second conductors that electrically connect said second semiconductor device to said wiring pattern on said periphery.

2. The device of claim 1, wherein said first conductors extend over said first surface through said spacer.

3. The device of claim 2, wherein said spacer comprises an adhesive for attaching said spacer and said first conductors extend through said adhesive.

4. The device of claim 1, wherein said second semiconductor device has a larger areal extent than said first semiconductor device.

5. The device of claim 1, wherein said spacer comprises plural spacer members.

6. The device of claim 1, further comprising solder bumps on a second surface of said substrate opposite said first surface.

7. A semiconductor device, comprising:

a substrate having a first surface with a wiring pattern thereon;

a first semiconductor device attached to said first surface;

a second semiconductor device mounted on said first surface;

a spacer extending from said first surface to a height greater than a height of said first semiconductor device and being attached to said second semiconductor device, said spacer holding said second semiconductor device spaced from said first semiconductor device and so that said first semiconductor device is sandwiched between said second semiconductor device and said first surface;

an adhesive attaching said spacer to said first surface;

first conductors that electrically connect said first semiconductor device to said wiring pattern, said first conductors extending across said first surface from said first semiconductor device and through said adhesive to beyond a peripheral extent of said second semiconductor device; and second conductors that electrically connect said second semiconductor device to said wiring pattern.

8. The device of claim 7, wherein said second semiconductor device has a larger areal extent than said first semiconductor device.

9. The device of claim 7, wherein said spacer comprises plural spacer members.

10. The device of claim 7, further comprising solder bumps on a second surface of said substrate opposite said first surface.

11. The device of claim 7, wherein said wiring pattern is on a periphery of said first surface.

12. A method of making a semiconductor device, comprising the steps of:

providing a wiring pattern on a periphery of a first surface of a substrate;

attaching a first semiconductor device to the first surface inside the periphery;

mounting a spacer on the first surface between the first semiconductor device and the periphery, the spacer extending from the first surface to a height greater than a height of the first semiconductor device;

attaching a second semiconductor device to the spacer so that the second semiconductor device is spaced from the first semiconductor device and so that the first semiconductor device is sandwiched between the second semiconductor device and the first surface;

electrically connecting the first semiconductor device to the wiring pattern on the periphery with first conductors; and electrically connecting the second semiconductor device to the wiring pattern on the periphery with second conductors.

13. The method of claim 12, wherein the first conductors are extended over the first surface through the spacer.

14. The method of claim 13, wherein the spacer is attached with an adhesive and the first conductors extend through the adhesive.

15. The method of claim 12, further comprising the step of forming solder bumps on a second surface of the substrate opposite the first surface.

* * * * *